(12) United States Patent
Qiu et al.

(10) Patent No.: US 9,142,736 B2
(45) Date of Patent: Sep. 22, 2015

(54) LED (LIGHT-EMITTING DIODE) ENCAPSULATION AND MANUFACTURING METHOD THEREOF

(71) Applicant: Shenzhen China Star Optoelectronics Technology Co., Ltd., Shenzhen, Guangdong (CN)

(72) Inventors: Yongyuan Qiu, Guangdong (CN); Chihtsung Kang, Guangdong (CN); Shengjer Chang Chien, Guangdong (CN); Zanjia Su, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/236,675

(22) PCT Filed: Jan. 3, 2014

(86) PCT No.: PCT/CN2014/070116
§ 371 (c)(1),
(2) Date: Feb. 3, 2014

(87) PCT Pub. No.: WO2015/085657
PCT Pub. Date: Jun. 18, 2015

(65) Prior Publication Data
US 2015/0214445 A1    Jul. 30, 2015

(51) Int. Cl.
*H01L 21/00* (2006.01)
*H01L 33/50* (2010.01)
(Continued)

(52) U.S. Cl.
CPC .............. *H01L 33/505* (2013.01); *H01L 27/15* (2013.01); *H01L 33/005* (2013.01);
(Continued)

(58) Field of Classification Search
CPC ........................... H01L 33/505; H01L 33/483
USPC ................................................ 438/35; 257/93
See application file for complete search history.

(56) References Cited

U.S. PATENT DOCUMENTS

2012/0154417 A1* 6/2012 Ninan et al. ................... 345/581
2013/0010229 A1* 1/2013 Shin et al. ........................ 349/62

FOREIGN PATENT DOCUMENTS

| CN | 101154699 A | 4/2008 |
| CN | 101580628 A | 11/2009 |
| CN | 102222750 A | 10/2011 |

OTHER PUBLICATIONS

Translation of CN102222750A(Oct. 2011), "White LED Device", Ma et al, 7 pages.*

*Primary Examiner* — Caridad Everhart
(74) *Attorney, Agent, or Firm* — Andrew C. Cheng (57) ABSTRACT

The present invention provides an LED encapsulation and a manufacturing method thereof. The LED encapsulation includes: a first frame (10), a plurality of LED elements (20), encapsulant (30), and the quantum dot rail (40). The first frame (10) includes a PCB (12) and four sidewalls (14). The four sidewalls (14) surround and circumferentially delimit an accommodation space (18). The plurality of LED elements (20) is mounted on the PCB (12) and in electrical connection therewith. The encapsulant (30) is filled in the accommodation space (18). The four sidewalls (14) each have a top end portion forming a mounting section (16). The quantum dot rail (40) is mounted in the mounting sections (16) so that the quantum dot rail (40) is located above the encapsulant (30). The first frame (10), the plurality of LED elements (20), and the quantum dot rail (40) are collectively and integrally encapsulated so as to be fixedly assembled together.

14 Claims, 8 Drawing Sheets

(51) Int. Cl.
*H01L 33/48* (2010.01)
*H01L 33/52* (2010.01)
*H01L 27/15* (2006.01)
*H01L 33/00* (2010.01)

(52) U.S. Cl.
CPC .............. *H01L 33/483* (2013.01); *H01L 33/52* (2013.01); *H01L 2933/005* (2013.01); *H01L 2933/0033* (2013.01); *H01L 2933/0041* (2013.01)

LED (LIGHT-EMITTING DIODE) ENCAPSULATION AND MANUFACTURING METHOD THEREOF

BACKGROUND OF THE INVENTION

1. Field of the Invention

The present invention relates to the field of LED (Light-Emitting Diode) encapsulation technology, and in particular to and LED encapsulation comprising a quantum device and a manufacturing method thereof.

2. The Related Arts

Figure 1:
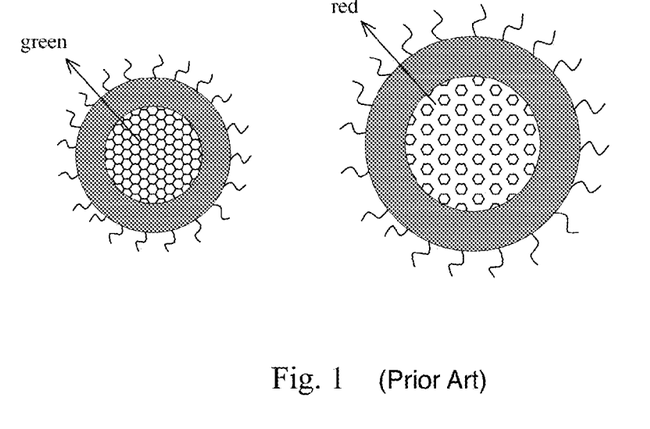
FIG. 1 is a schematic view showing the structure of a conventional quantum dot.

A quantum dot (QD), which is also referred to as a nanocrysal, is formed of a limited number of atoms and has three dimensional sizes all in the order of nanometers. Referring to FIG. 1, the quantum dot is generally in the form of sphere or a sphere-like shape and is a nanometer particle made of a semiconductor material (commonly composed of groups II-VI or group III-V elements) and having a stable diameter between 1-10 nm. The quantum dot is a nanometer scale aggregate of atoms and molecules and can be formed of one kind of semiconductor material, such as composed of elements of groups II and VI (for example CdS, CdSe, CdTe, ZnSe, and the likes) or elements of groups III and V (for example InP, InAs, and the likes), or can alternatively be composed to two kinds or more than two kinds of semiconductor materials.

The quantum dot is a semiconducting nanometer structure that confines conduction band electrons, valence band holes, and excitons in three spatial directions. Since the conduction band electrons and the valence band holes are subjected to quantum confinement, the continuous energy band converts into spilt energy levels having molecular characteristics and fluorescence occurs upon excitement. Due to the quantum effect, the quantum dot has a prosperous future of wide applications in various fields, such as solar cells, light emission devices, and optic bio-marking.

Figure 2:
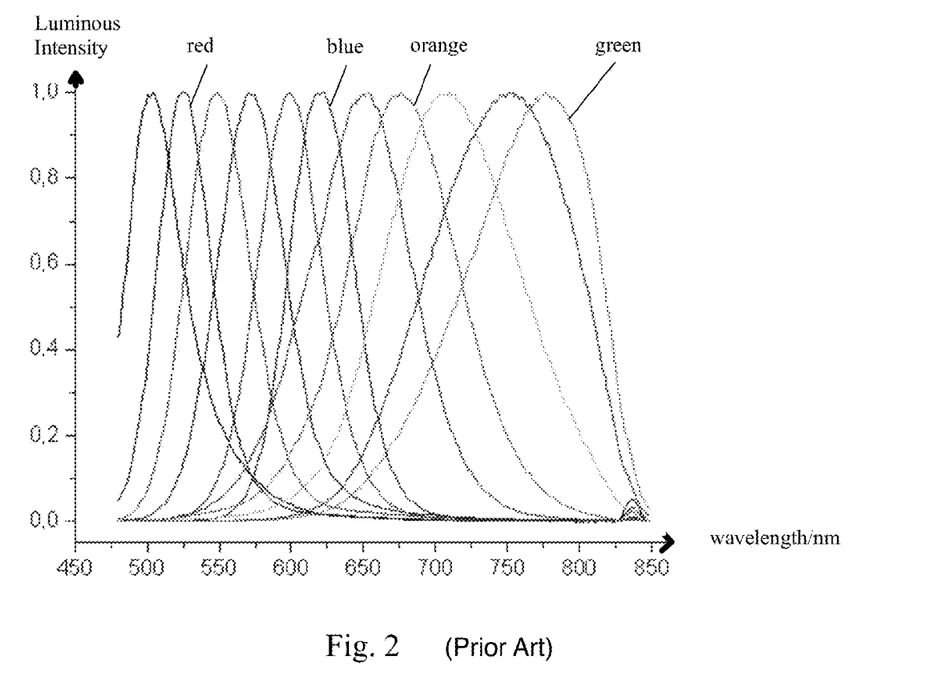
FIG. 2 is a schematic view showing a light emission spectrum of the conventional quantum dot.

The photo-electronic characteristics of a quantum dot are closely related to the size and shape thereof. Researches reveal that the band gap of a quantum dot is inversely proportional to the size. In other words, the smaller the size of a quantum dot is, the wider the band gap will be, making an emitting light shifted toward blue. Thus, controlling the sizes of quantum dots allows for production of quantum dots that give of different spectra of light emission. The intensity of a light emission spectrum of a quantum dot is illustrated in FIG. 2. It can be seen from the drawing that the half-peak width (around 50-60 nm) of a quantum dot is narrower than those of the green (having a half-peak width of 80 nm) and red (having a half-peak width of 100 nm) fluorescent powders commonly used in the conventional LED lights. For television applications, it can be well used in combination with photoresist (color filter (CF)) to exhibit high transmittance while ensuring high color gamut.

Figure 3:
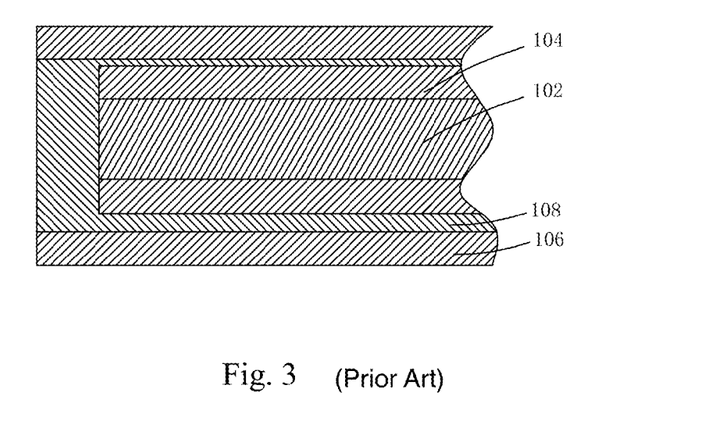
FIG. 3 is a schematic view showing a conventional quantum dot film.
Figure 4:
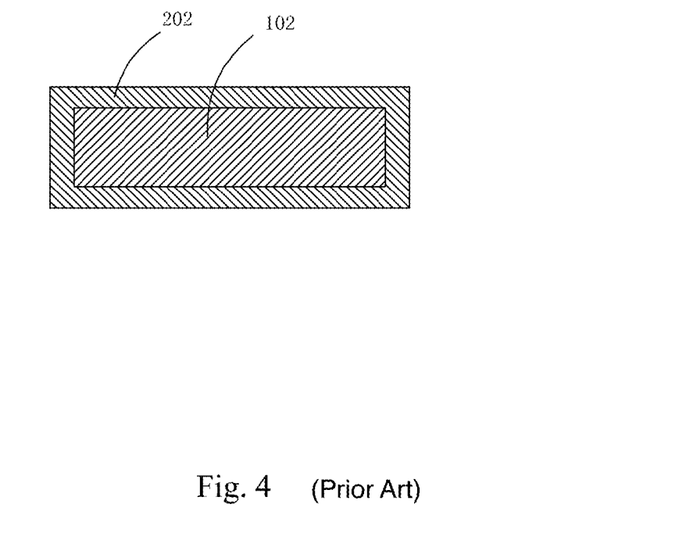
FIG. 4 is a schematic view showing a conventional quantum dot rail.

Heretofore, the commercial quantum dot materials generally comprise a core made of cadmium selenide (CdSe) and a shell made of cadmium sulfide (CdS). The quantum dot material may get failure when affected by high temperatures and oxygen. Thus, currently, the commercial uses of quantum dots require protections of the quantum dot material. The protection of the quantum dot material can be realized through two ways, of which one is made in the form of a quantum dot film (QD film) having a structure illustrated in FIG. 3, in which polyethylene terephthalate (PET) material 104 is used to encapsulate a quantum dot material 102, a moisture barrier layer 106 and an LED encapsulant 108 being also shown in the drawing; and another way is made in the form of a quantum dot rail (QD rail) having a structure illustrated in FIG. 4, in which a hollow glass tube 202 is used to encapsulate a quantum dot material 102.

Figure 5:
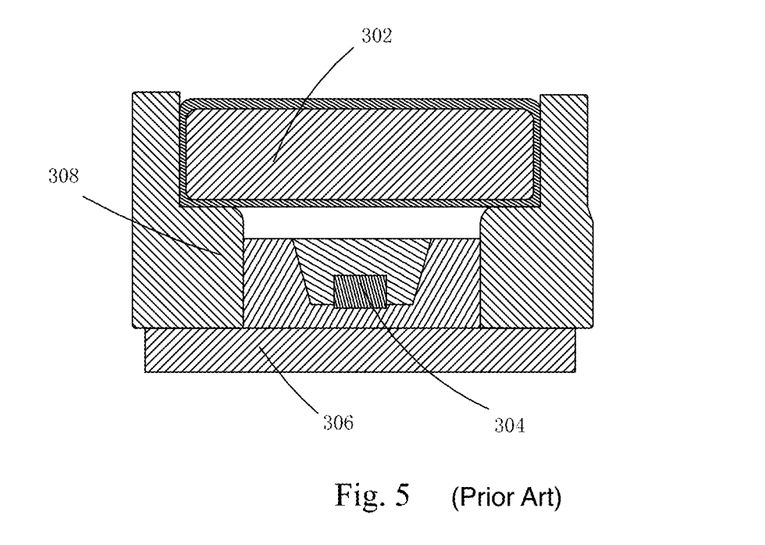
FIG. 5 is a cross-sectional view showing a combination of a quantum dot rail and an LED element in a conventional side edge backlight module.
Figure 6:
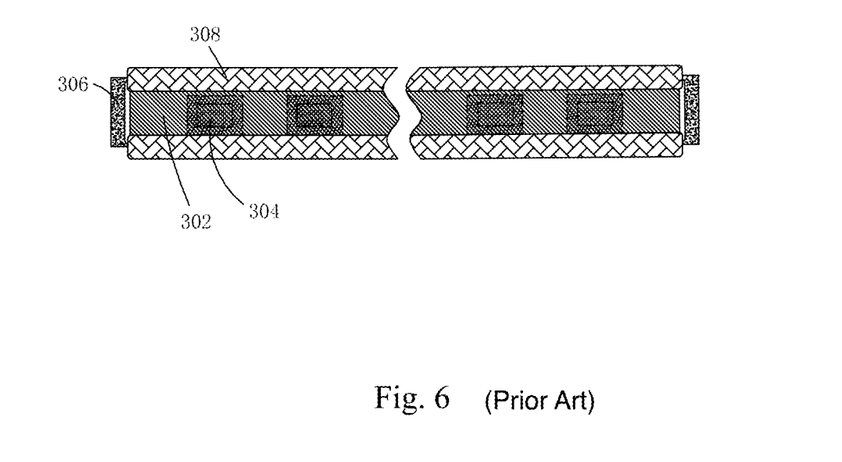
Figure 7:
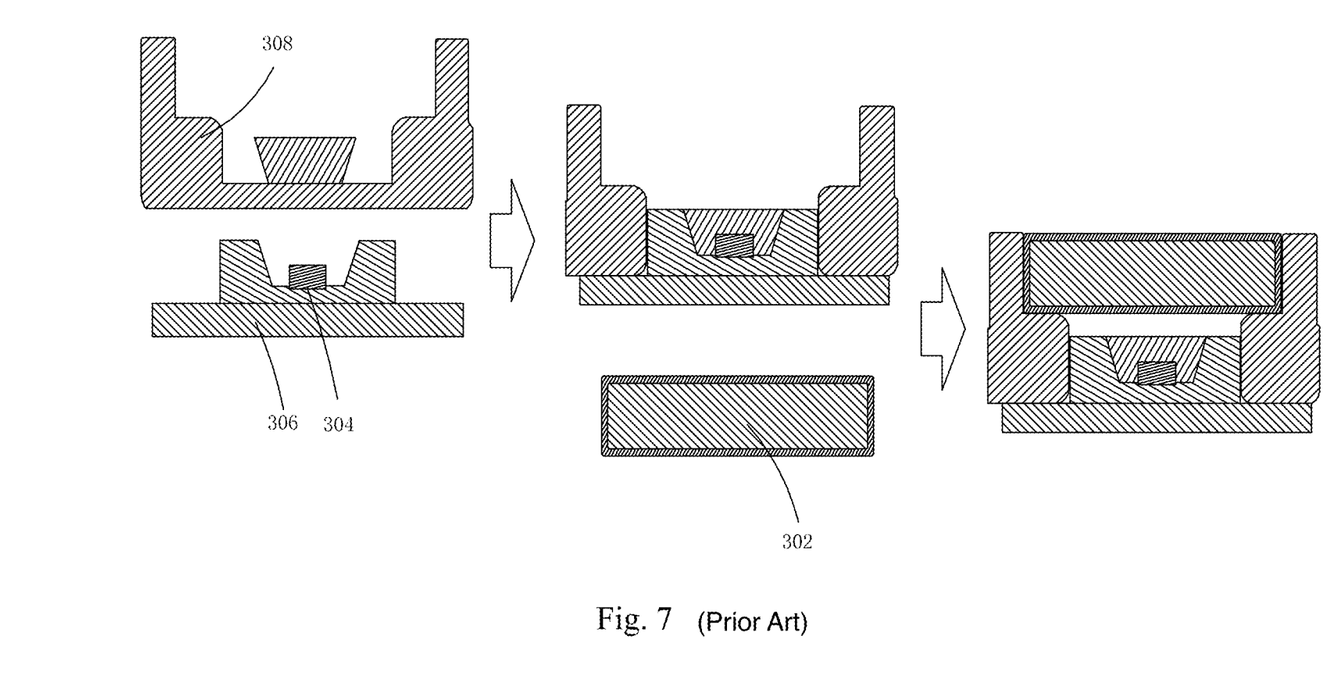
FIG. 7 illustrates a flow of assembling the quantum dot rail and the LED element of the conventional side edge backlight module.

The QD film uses more quantum dot material and is hard to control chromaticity in a back light unit (BLU) and has a poor mass-productivity. On the other hand, the QD rail has a better mass-productivity in respect of price and chromaticity control. In the applications of side edge backlight modules, a QD rail and an LED element 304 are positioned and assembled as illustrated in FIGS. 5 and 6, where the LED element 304 is mounted in a mixing cup 308 arranged on a PCB (Printed Circuit Board) 306 and is electrically connected to the PCB 306. The mixing cup has a light exit surface and the QD rail 302 is positioned on the light exit surface. A flow of assembling the QD rail 302 and the LED element 304 is illustrated in FIG. 7, where the assembly of the QD rail 302 and the LED element 304 includes three steps: Firstly, the LED element 304 is mounted on the PCB 306 and the LED 304 is also electrically connected to the PCB 306; secondly, a mixing cup 307 is formed on the PCB 306; and thirdly, the QD rail 302 is mounted on a light exit surface of the mixing cup 308. To ensure the utilization of the QD rail 302 and to suppress light leaking, the combination of the QD rail 302 and the LED element 304 must maintain perfect aligning. Further, the combination of the mixing cup 308 and the QD rail 302 must also maintain excellent stability to avoid the occurrence of shaking and detachment. Since the glass tube of the QD rail 302 is fragile, the assembling process faces great challenges and risks.

SUMMARY OF THE INVENTION

An object of the present invention is to provide an LED encapsulation, in which a quantum dot rail and an LED element are encapsulated in an integrated manner to achieve secure assembling and reducing the assembling difficult of a backlight module including a quantum dot rail and also to avoid the issue of light leak caused by imperfect alignment of the LED element and the quantum dot rail that occurs in the known techniques to thus reduce the width of a side frame of a television using the LED encapsulation.

Another object of the present invention is to provide a manufacturing method of an LED encapsulation, which has a simple operation and integrally encapsulates a quantum dot rail and an LED element to achieve secure assembling and reducing the assembling difficult of a backlight module including a quantum dot rail and also to avoid the issue of light leak caused by imperfect alignment of the LED element and the quantum dot rail that occurs in the known techniques to thus reduce the width of a side frame of a television using the LED encapsulation.

To achieve the above objects, the present invention provides an LED encapsulation, which comprises: a first frame, a plurality of LED elements, encapsulant, and a quantum dot rail. The first frame comprises a PCB and four sidewalls respectively formed on four peripheral edges of the PCB. The four sidewalls surround and circumferentially delimit an accommodation space. The plurality of LED elements is mounted on the PCB and located in the accommodation space and in electrically connection with the PCB. The encapsulant is filled in the accommodation space. The four sidewalls each have a top end portion that forms a mounting section. The quantum dot rail is mounted in the mounting sections in such a way that the quantum dot rail is located above the encapsulant. The first frame, the plurality of LED elements, and the quantum dot rail are collectively and integrally encapsulated to be fixedly assembled together.

The mounting sections each comprise a position-constraining slot. The position-constraining slot hays a height substantially equal to a thickness of the quantum dot rail to receive the quantum dot rail to fit in and retained in the position-constraining slot.

The plurality of LED elements comprises a plurality of LED chips and the LED chips are regular, non-flip blue chips or flip blue chips, whereby when the plurality of LED elements is a plurality of non-flip blue chips, each of the LED elements is subjected to a die bonding process and a wire bonding process to be mounted to the PCB and when the plurality of LED elements is a plurality of flip blue chips, each of the LED elements is subjected to a die bonding process to be mounted to the PCB.

Each of the LED elements comprises: a second frame and an LED chip mounted to the second frame and electrically connected to the second frame. The plurality of LED elements is subjected to a reflow process to be mounted to the PCB. The LED chips are regular, non-flip blue chips or flip blue chips, whereby when the LED chips are non-flip blue chips, the LED chips are subjected to a die bonding process and a wire bonding process to be mounted to the second frame and when the LED chips are flip blue chips, the LED chips are subjected to a die bonding process to be mounted to the second frame.

The quantum dot rail comprises: a glass tube and a quantum dot material hermetically enclosed in the glass tube. The position-constraining slots have a depth equal to or greater than a tube wall thickness of the glass tube. The glass tube has an end having a rectangular cross-section. The four sidewalls are made of poly-1,4-cyclohexylene dimethylene terephthalate. The encapsulant is silicone gel.

The present invention also provides a manufacturing method of an LED encapsulation, which comprises the following steps:

(1) providing a first frame, wherein the first frame comprises a PCB and four sidewalls respectively formed on four peripheral edges of the PCB, the four sidewalls each have a top end portion that forms a mounting section, and the four sidewalls surround and circumferentially delimit an accommodation space;

(2) providing a plurality of LED elements and mounting the plurality of LED elements to the PCB of the first frame with the plurality of LED elements located in the accommodation space and the plurality of LED elements electrically connected to the PCB;

(3) filling encapsulant into the accommodation space of the first frame;

(4) providing a quantum dot rail and mounting the quantum dot rail in the mounting sections of the four sidewalls so that the quantum dot rail is located above the encapsulant; and (5) curing the encapsulant.

The plurality of LED elements comprises a plurality of LED chips and the LED chips are regular, non-flip blue chips or flip blue chips, whereby when the LED chips are non-flip blue chips, step (2) comprises applying a die bonding process and a wire bonding process to mount the LED chips to the PCB and when the LED chips are flip blue chips, step (2) comprises applying a die bonding process to mount the LED chips to the PCB.

Each of the LED elements comprises: a second frame and an LED chip mounted to the second frame and electrically connected to the second frame and in step (2), the plurality of LED elements are mounted to the PCB by means of a reflow process and the LED chips are regular, non-flip blue chips or flip blue chips, whereby when the LED chips are non-flip blue chips, the LED chips are subjected to a die bonding process and a wire bonding process to be mounted to the second frames and when the LED chips are flip blue chips, the LED chips are subjected to a die bonding process to be mounted to the second frames.

The mounting sections each comprise a position-constraining slot. The position-constraining slot has a height substantially equal to a thickness of the quantum dot rail and in step (4), the quantum dot rail is fit in and retained in the position-constraining slots. In step (5), heating is applied to achieve the curing of the encapsulant.

The quantum dot rail comprises: a glass tube and a quantum dot material hermetically enclosed in the glass tube. The position-constraining slots have a depth equal to or greater than a tube wall thickness of the glass tube. The glass tube has an end having a rectangular cross-section. The four sidewalls are made of poly-1,4-cyclohexylene dimethylene terephthalate. The encapsulant is silicone gel.

The present invention further provides a manufacturing method of an LED encapsulation, which comprises the following steps:

(1) providing a first frame, wherein the first frame comprises a PCB and four sidewalls respectively formed on four peripheral edges of the PCB, the four sidewalls each have a top end portion that forms a mounting section, and the four sidewalls surround and circumferentially delimit an accommodation space;

(2) providing a plurality of LED elements and mounting the plurality of LED elements to the PCB of the first frame with the plurality of LED elements located in the accommodation space and the plurality of LED elements electrically connected to the PCB;

(3) filling encapsulant into the accommodation space of the first frame;

(4) providing a quantum dot rail and mounting the quantum dot rail in the mounting sections of the four sidewalls so that the quantum dot rail is located above the encapsulant; and (5) curing the encapsulant;

wherein the plurality of LED elements comprises a plurality of LED chips and the LED chips are regular, non-flip blue chips or flip blue chips, whereby when the LED chips are non-flip blue chips, step (2) comprises applying a die bonding process and a wire bonding process to mount the LED chips to the PCB and when the LED chips are flip blue chips, step (2) comprises applying a die bonding process to mount the LED chips to the PCB.

Each of the LED elements comprises: a second frame and an LED chip mounted to the second frame and electrically connected to the second frame and in step (2), the plurality of LED elements are mounted to the PCB by means of a reflow process and the LED chips are regular, non-flip blue chips or flip blue chips, whereby when the LED chips are non-flip blue chips, the LED chips are subjected to a die bonding process and a wire bonding process to be mounted to the second frames and when the LED chips are flip blue chips, the LED chips are subjected to a die bonding process to be mounted to the second frames.

The mounting sections each comprise a position-constraining slot. The position-constraining slot has a height substantially equal to a thickness of the quantum dot rail and in step (4), the quantum dot rail is fit in and retained in the position-constraining slots. In step (5), heating is applied to achieve the curing of the encapsulant.

The quantum dot rail comprises: a glass tube and a quantum dot material hermetically enclosed in the glass tube. The position-constraining slots have a depth equal to or greater than a tube wall thickness of the glass tube. The glass tube has an end having a rectangular cross-section. The four sidewalls are made of poly-1,4-cyclohexylene dimethylene terephthalate. The encapsulant is silicone gel.

The efficacy of the present invention is that the present invention provides an LED encapsulation and a manufacturing method thereof, wherein a quantum dot rail and an LED element are integrally encapsulated to achieve secure fixing, reduce the difficulty of assembly of a backlight module using the quantum dot rail, and to avoid the occurrence of light leak resulting from imperfect alignment of an LED element and a quantum dot rail occurring in the known techniques to thereby reduce width of a side frame of a television using the LED encapsulation.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 8:
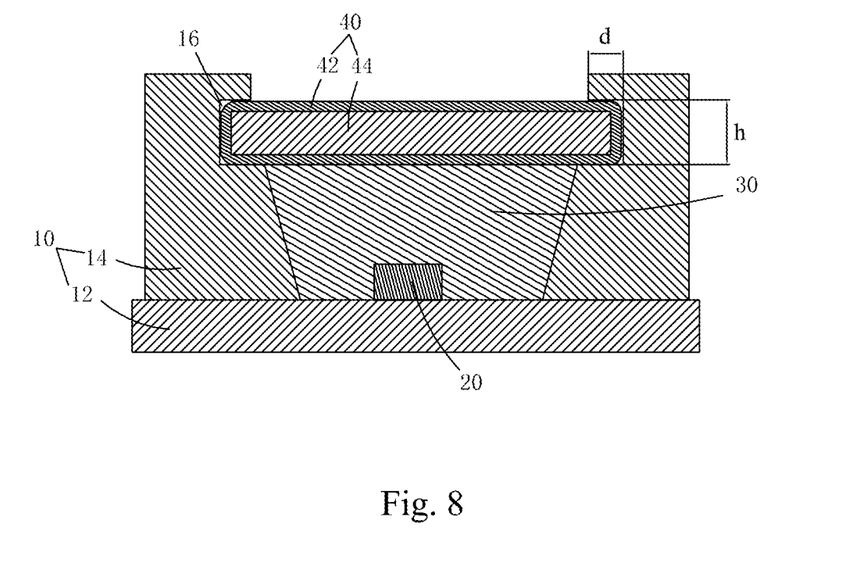
FIG. 8 is a cross-sectional view showing an LED encapsulation according to an embodiment of the present invention.
Figure 9:
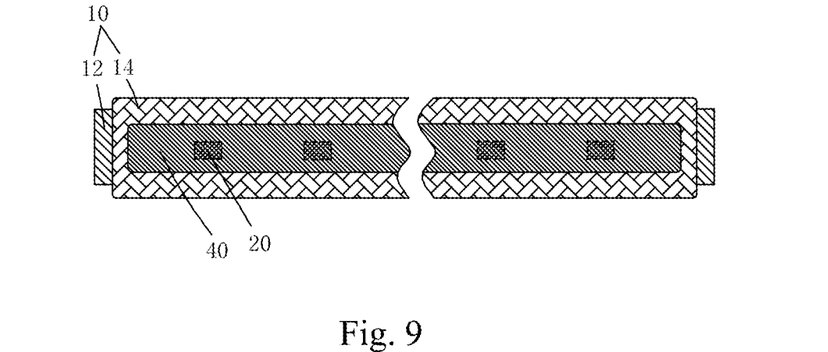
FIG. 9 is a top plan view of the LED encapsulation shown in FIG. 8.
Figure 10:
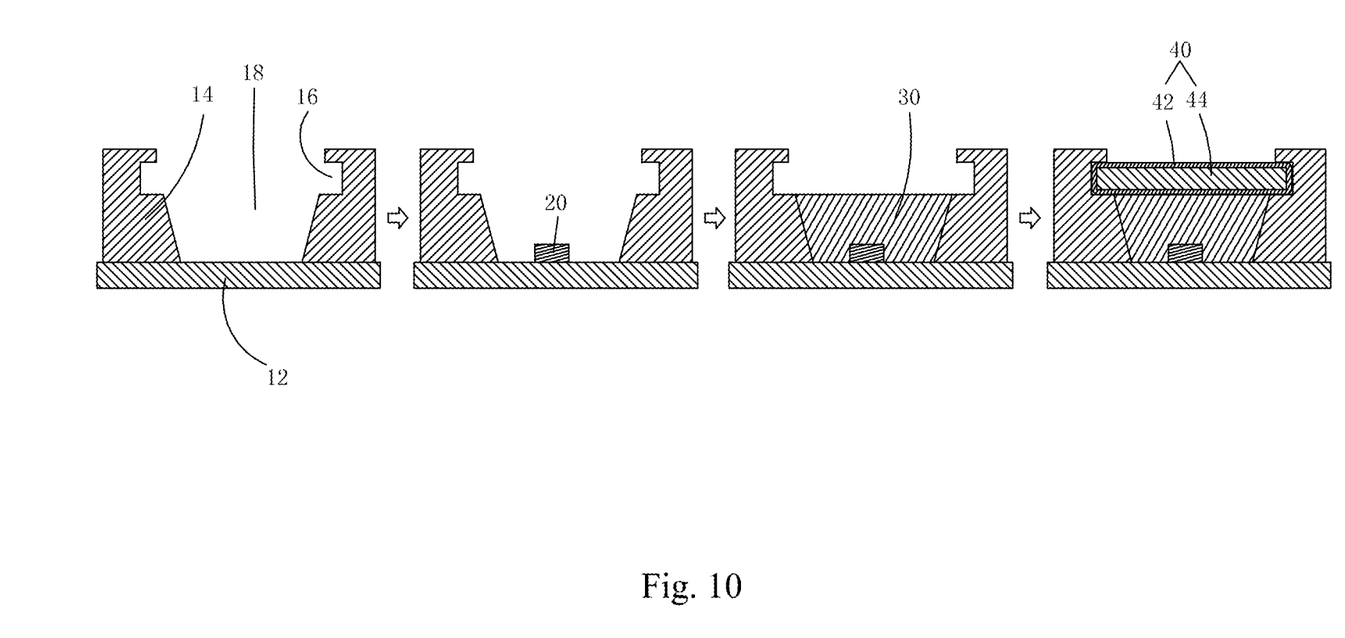
FIG. 10 illustrates a flow of manufacturing the LED encapsulation shown in FIG. 8.

Referring to FIGS. 8-10, the present invention provides an LED (Light-Emitting Diode) encapsulation, which is applicable to a backlight module of the field of display technology and specifically comprises: a first frame 10, a plurality of LED elements 20, encapsulant 30, and a quantum dot rail 40. The first frame 10 comprises a PCB (Printed Circuit Board) 12 and four sidewalls 14 respectively formed on four peripheral edges of the PCB 12. The four sidewalls 14 surround and circumferentially delimit an accommodation space 18. The plurality of LED elements 20 is mounted on the PCB 12 and is located in the accommodation space 18 and in electrically connection with the PCB 12. The encapsulant 30 is filled in the accommodation space 18, the four sidewalls 14 each have a top end portion that forms a mounting section 16 and the quantum dot rail 40 is mounted in the mounting sections 16 in such a way that the quantum dot rail 40 is located above the encapsulant 30. The first frame 10, the plurality of LED elements 20, and the quantum dot rail 40 are collectively and integrally encapsulated to be fixedly assembled together in order to reduce the difficult of assembly of a backlight module that uses the quantum dot rail 40 and also to avoid the occurrence of light leak that results from imperfect alignment between a quantum dot rail and an LED element occurring in the known techniques.

The plurality of LED elements 20 is mounted on the PCB 12 and is electrically connected to the PCB 12 to achieve an effect of an LED light bar. A method for making the first frame 10 is as follows. An injection molding operation is applied to the PCB 12 of which a circuit structure has been completed through etching to form the four sidewalls 14 on the PCB 12. The plurality of LED elements 20, the encapsulant 30, and the quantum dot rail 40 are all received and retained in the accommodation space 18. The four sidewalls 14 have top end portions that are formed with the mounting sections 16. The encapsulant 30 is filled into the accommodation space 18 to such a height as to correspond to the mounting sections 16. The quantum dot rail 40 is mounted and fixed in the mounting sections 16. In the instant embodiment, the mounting sections 16 are each a position-constraining slot and the position-constraining slot has a height h corresponding to a thickness of the quantum dot rail 40 so as to snugly receive the quantum dot rail 40 to fit in and be retained in the position-constraining slot. The four sidewalls 14 are made of a material that is preferably poly-1,4-cyclohexylene dimethylene terephthalate (PCT).

The plurality of LED elements 20 is a plurality of LED chips. The plurality of LED chips are directly bonded to the PCB 12 by means of COB (Chip-on-board) bonding in order to achieve an effect of an LED light bar. Preferably, the LED chip is a regular, non-flip blue chip or a flip blue chip. If the plurality of LED elements 20 is a plurality of non-flip blue chips, each of the LED elements 20 is subjected to a die bonding process and a wire bonding process to be mounted to the PCB 12; and if the plurality of LED elements 20 is a plurality of flip blue chips, the wire bonding process is omitted, meaning each of the LED elements 20 is subjected to a die bonding process to be mounted to the PCB 12.

The quantum dot rail 40 comprises: a glass tube 42 and a quantum dot material 44 hermetically enclosed in the glass tube 42. The position-constraining slots have a depth d equal to or greater than a thickness of tube wall of the glass tube 42. Under the condition that the depth d of the position-constraining slot is definitely equal to or greater than the thickness of the tube wall of the glass tube 42, it should be made as small as possible so that through lightly pressing the quantum dot rail 40, the quantum dot rail 40 can be efficiently mounted into the position-constraining slot without causing any damage to the quantum dot rail 40. The glass tube 42 has an end having a rectangular cross-sectional shape in order to facilitate thinning of the LED encapsulation. It is noted that in the instant embodiment, the LED chip is a blue chip that emits blue light. If the light emitting from the LED chip goes out through edges of the quantum dot rail 40, the light so going out is blue light. This does not suit the needs. To prevent the occurrence of the above situation, the depth d of the position-constraining slots of the four sidewalls 14 of the first frame 10 is made equal to (or slightly greater than) the thickness of the tube wall of the glass tube 42 of the quantum dot rail 12 in order to prevent the light emitting from the LED chip to transmit through the circumferential tube wall of the glass tube 42 to project out. Under this condition, the blue light emitting from the LED chip is all forced to transmit through the quantum dot material 44 contained in the quantum dot rail 40 so that the finally projected light is a white light.

The encapsulant 30 functions to fix the quantum dot rail 12 located thereon and to protect the exposed LED chip (and exposed conductive lines). The encapsulant 30 is preferably a silicone gel.

Figure 11:
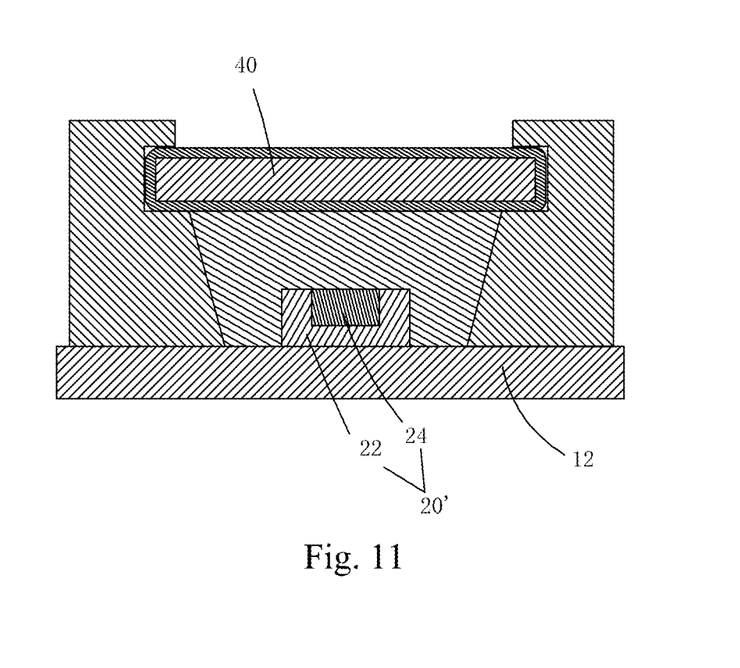
FIG. 11 is a cross-sectional view showing an LED encapsulation according to another embodiment of the present invention.
Figure 12:
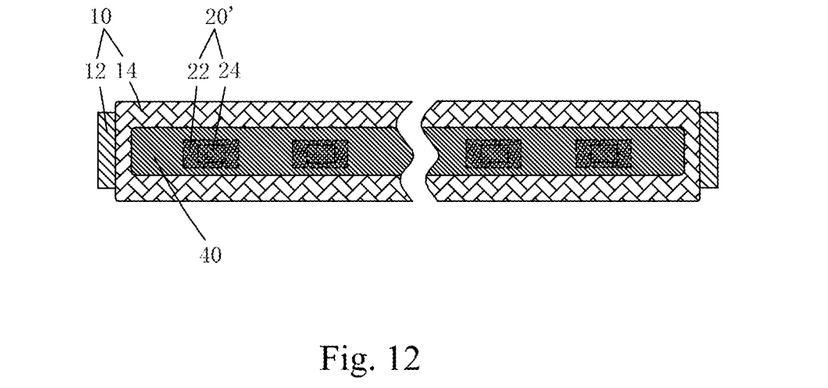
FIG. 12 is a top plan view of the LED encapsulation shown in FIG. 11.

Referring to FIGS. 11 and 12, another preferred embodiment is provided as an alternative, wherein the plurality of LED elements 20' is a plurality of LED lights, which is subject to a reflow process to be mounted to the PCB 12. Specifically, each of the LED elements 20' comprises: a second frame 22 and an LED chip 24 mounted to the second frame 22 and electrically connected to the second frame 22. The second frame 22 is provided for better protecting the LED chip 24 and also to increase a total height of the quantum dot rail 40 and the PCB 12. The LED chip 24 is a regular, non-flip blue chip or a flip blue chip. If the LED chip 24 is a non-flip blue chip, the LED chip 24 is subjected to a die bonding process and a wire bonding process to be mounted to the second frame 22 and if the LED chip 24 is a flip blue chip, the LED chip 24 is subjected to a die bonding process to be mounted to the second frame 22.

Figure 13:
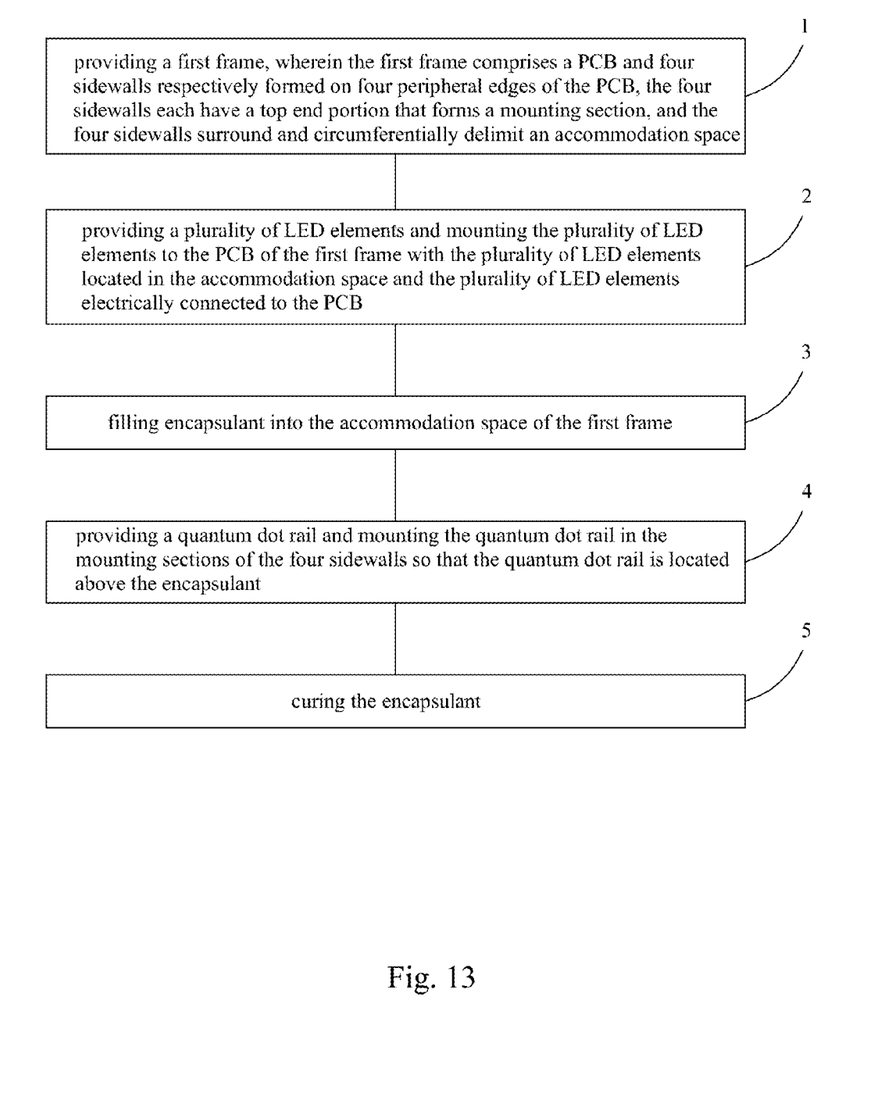
FIG. 13 is a flow chart showing a manufacturing method of an LED encapsulation according to the present invention.

Referring to FIG. 13, with additional reference to FIGS. 8-12, the present invention also provides a manufacturing method of an LED encapsulation, which comprises the following steps:

Step 1: providing a first frame 10, wherein the first frame 10 comprises a PCB 12 and four sidewalls 14 respectively formed on four peripheral edges of the PCB 12, the four sidewalls 14 each have a top end portion that forms a mounting section 16, and the four sidewalls 14 surround and circumferentially delimit an accommodation space 18.

A method for making the first frame 10 is as follows. An injection molding operation is applied to the PCB 12 of which a circuit structure has been completed through etching to form the four sidewalls 14 on the PCB 12. The four sidewalls 14 have top end portions that are formed with the mounting sections 16. In the instant embodiment, the mounting sections 16 are each a position-constraining slot and the position-constraining slot has a width that is equal to (or slightly greater than) an edge thickness of the quantum dot rail to ensure blue light emitting from the LED chip to completely transmit through the quantum dot material contained in the quantum dot rail so that the finally projected light is a white light. The four sidewalls 14 are made of a material that is preferably poly-1,4-cyclohexylene dimethylene terephthalate (PCT).

Step 2: providing a plurality of LED elements 20 and mounting the plurality of LED elements 20 to the PCB 12 of the first frame 10 with the plurality of LED elements 20 located in the accommodation space 18 and the plurality of LED elements 20 electrically connected to the PCB 12.

In a preferred embodiment, the plurality of LED elements 20 is a plurality of LED chips as shown in FIGS. 8-10. In the step, the plurality of LED chips are directly bonded to the PCB 12 by means of COB (Chip-on-board) bonding in order to achieve an effect of an LED light bar. Specifically, the LED chip is a regular, non-flip blue chip or a flip blue chip. If the LED chip is a non-flip blue chip, then in the step, a die bonding process and a wire bonding process are applied to mount the LED chip to the PCB 12; and if the LED chip is a flip blue chip, then in the step, only the die bonding process is needed to mount the LED chip to the PCB 12.

As an alternative preferred embodiment, the plurality of LED elements 20' is a plurality of LED lights as shown in FIGS. 11 and 12. In the step, it is subjected to a reflow process to be mounted to the PCB 12 in order to achieve an effect of an LED light bar. Specifically, each of the LED elements 20' comprises: a second frame 22 and an LED chip 24 mounted to the second frame 22 and electrically connected to the second frame 22. The second frame 22 is provided for better protecting the LED chip 24 and also to increase a total height of the quantum dot rail 40 and the PCB 12. The LED chip 24 is a regular, non-flip blue chip or a flip blue chip. If the LED chip 24 is a non-flip blue chip, the LED chip 24 is subjected to a die bonding process and a wire bonding process to be mounted to the second frame 22 and if the LED chip 24 is a flip blue chip, the LED chip 24 is subjected to a die bonding process to be mounted to the second frame 22.

Step 3: filling encapsulant 30 into the accommodation space 18 of the first frame 10.

The encapsulant 30 functions to protect the exposed LED chip (and exposed conductive lines) and the encapsulant is filled in the accommodation space 18 to such a height as to correspond to the position-constraining slot 16. The encapsulant 30 is preferably a silicone gel.

Step 4: providing a quantum dot rail 40 and mounting the quantum dot rail 40 in the mounting sections 16 of the four sidewalls 14 so that the quantum dot rail 40 is located above the encapsulant 30.

In the instant embodiment, the mounting sections 16 are each a position-constraining slot and the position-constraining slot has a height h corresponding to a thickness of the quantum dot rail 40. In step 4, the quantum dot rail 40 is fit in and retained in the position-constraining slot.

The quantum dot rail 40 comprises: a glass tube 42 and a quantum dot material 44 hermetically enclosed in the glass tube 42. The position-constraining slots have a depth d equal to or greater than a thickness of tube wall of the glass tube 42. Under the condition that the depth d of the position-constraining slot is definitely equal to or greater than the thickness of the tube wall of the glass tube 42, it should be made as small as possible so that through lightly pressing the quantum dot rail 40, the quantum dot rail 40 can be efficiently mounted into the position-constraining slot without causing any damage to the quantum dot rail 40. The glass tube 42 has an end having a rectangular cross-sectional shape in order to facilitate thinning of the LED encapsulation. It is noted that in the instant embodiment, the LED chip is a blue chip that emits blue light. If the light emitting from the LED chip goes out through edges of the quantum dot rail 40, the light so going out is blue light. This does not suit the needs. To prevent the occurrence of the above situation, the depth d of the position-constraining slots of the four sidewalls 14 of the first frame 10 is made equal to (or slightly greater than) the thickness of the tube wall of the glass tube 42 of the quantum dot rail 12 in order to prevent the light emitting from the LED chip to transmit through the circumferential tube wall of the glass tube 42 to project out. Under this condition, the blue light emitting from the LED chip is all forced to transmit through the quantum dot material 44 contained in the quantum dot rail 40 so that the finally projected light is a white light. Thus, all the light emitting from the LED chip is caused to completely transmit through the quantum dot material 44 of the quantum dot rail 40 to achieve that the light finally projected out is completely white light.

Step 5: curing the encapsulant 30.

In the step, heating is applied to cure the encapsulant. The encapsulant has adhesion so that the cured encapsulant can well fix the quantum dot rail 40 on the first frame 10.

In summary, the present invention provides an LED encapsulation and a manufacturing method thereof, wherein a quantum dot rail and an LED element are integrally encapsulated to achieve secure fixing, reduce the difficulty of assembly of a backlight module using the quantum dot rail, and to avoid the occurrence of light leak resulting from imperfect alignment of an LED element and a quantum dot rail occurring in the known techniques to thereby reduce width of a side frame of a television using the LED encapsulation.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An LED (Light-Emitting Diode) encapsulation, comprising: a first frame, a plurality of LED elements, encapsulant, and a quantum dot rail, the first frame comprising a PCB (Printed Circuit Board) and four sidewalls respectively formed on four peripheral edges of the PCB, the four sidewalls surrounding and circumferentially delimiting an accommodation space, the plurality of LED elements being mounted on the PCB and located in the accommodation space and in electrically connection with the PCB, the encapsulant being filled in the accommodation space, the four sidewalls each having a top end portion that forms a mounting section, the quantum dot rail being mounted in the mounting sections in such a way that the quantum dot rail is located above the encapsulant, the first frame, the plurality of LED elements, and the quantum dot rail being collectively and integrally encapsulated to be fixedly assembled together.

2. The LED encapsulation as claimed in claim 1, wherein the plurality of LED elements comprises a plurality of LED chips and the LED chips are regular, non-flip blue chips or flip blue chips, whereby when the plurality of LED elements is a plurality of non-flip blue chips, each of the LED elements is subjected to a die bonding process and a wire bonding process to be mounted to the PCB and when the plurality of LED elements is a plurality of flip blue chips, each of the LED elements is subjected to a die bonding process to be mounted to the PCB.

3. The LED encapsulation as claimed in claim 1, wherein each of the LED elements comprises: a second frame and an LED chip mounted to the second frame and electrically connected to the second frame, the plurality of LED elements being subjected to a reflow process to be mounted to the PCB, the LED chips being regular, non-flip blue chips or flip blue chips, whereby when the LED chips are non-flip blue chips, the LED chips are subjected to a die bonding process and a wire bonding process to be mounted to the second frame and when the LED chips are flip blue chips, the LED chips are subjected to a die bonding process to be mounted to the second frame.

4. The LED encapsulation as claimed in claim 1, wherein the mounting sections each comprise a position-constraining slot, the position-constraining slot having a height substantially equal to a thickness of the quantum dot rail to receive the quantum dot rail to fit in and retained in the position-constraining slot.

5. The LED encapsulation as claimed in claim 4, wherein the quantum dot rail comprises: a glass tube and a quantum dot material hermetically enclosed in the glass tube, the position-constraining slots having a depth equal to or greater than a tube wall thickness of the glass tube, the glass tube having an end having a rectangular cross-section; the four sidewalls are made of poly-1,4-cyclohexylene dimethylene terephthalate; and the encapsulant is silicone gel.

6. A manufacturing method of an LED (Light-Emitting Diode) encapsulation, comprising the following steps:
(1) providing a first frame, wherein the first frame comprises a PCB (Printed Circuit Board) and four sidewalls respectively formed on four peripheral edges of the PCB, the four sidewalls each have a top end portion that forms a mounting section, and the four sidewalls surround and circumferentially delimit an accommodation space;
(2) providing a plurality of LED elements and mounting the plurality of LED elements to the PCB of the first frame with the plurality of LED elements located in the accommodation space and the plurality of LED elements electrically connected to the PCB;
(3) filling encapsulant into the accommodation space of the first frame;
(4) providing a quantum dot rail and mounting the quantum dot rail in the mounting sections of the four sidewalls so that the quantum dot rail is located above the encapsulant; and
(5) curing the encapsulant.

7. The manufacturing method of the LED encapsulation as claimed in claim 6, wherein each of the LED elements comprises: a second frame and an LED chip mounted to the second frame and electrically connected to the second frame and wherein in step (2), the plurality of LED elements are mounted to the PCB by means of a reflow process and the LED chips are regular, non-flip blue chips or flip blue chips, whereby when the LED chips are non-flip blue chips, the LED chips are subjected to a die bonding process and a wire bonding process to be mounted to the second frames and when the LED chips are flip blue chips, the LED chips are subjected to a die bonding process to be mounted to the second frames.

8. The manufacturing method of the LED encapsulation as claimed in claim 6, wherein the mounting sections each comprise a position-constraining slot, the position-constraining slot having a height substantially equal to a thickness of the quantum dot rail and wherein in step (4), the quantum dot rail is fit in and retained in the position-constraining slots; and in step (5), heating is applied to achieve the curing of the encapsulant.

9. The manufacturing method of the LED encapsulation as claimed in claim 6, wherein the plurality of LED elements comprises a plurality of LED chips and the LED chips are regular, non-flip blue chips or flip blue chips, whereby when the LED chips are non-flip blue chips, step (2) comprises applying a die bonding process and a wire bonding process to mount the LED chips to the PCB and when the LED chips are flip blue chips, step (2) comprises applying a die bonding process to mount the LED chips to the PCB.

10. The manufacturing method of the LED encapsulation as claimed in claim 9, wherein the quantum dot rail comprises: a glass tube and a quantum dot material hermetically enclosed in the glass tube, the position-constraining slots having a depth equal to or greater than a tube wall thickness of the glass tube, the glass tube having an end having a rectangular cross-section; the four sidewalls are made of poly-1,4-cyclohexylene dimethylene terephthalate; and the encapsulant is silicone gel.

11. A manufacturing method of an LED (Light-Emitting Diode) encapsulation, comprising the following steps:

(1) providing a first frame, wherein the first frame comprises a PCB (Printed Circuit Board) and four sidewalls respectively formed on four peripheral edges of the PCB, the four sidewalls each have a top end portion that forms a mounting section, and the four sidewalls surround and circumferentially delimit an accommodation space;

(2) providing a plurality of LED elements and mounting the plurality of LED elements to the PCB of the first frame with the plurality of LED elements located in the accommodation space and the plurality of LED elements electrically connected to the PCB;

(3) filling encapsulant into the accommodation space of the first frame;

(4) providing a quantum dot rail and mounting the quantum dot rail in the mounting sections of the four sidewalls so that the quantum dot rail is located above the encapsulant; and (5) curing the encapsulant;

wherein the plurality of LED elements comprises a plurality of LED chips and the LED chips are regular, non-flip blue chips or flip blue chips, whereby when the LED chips are non-flip blue chips, step (2) comprises applying a die bonding process and a wire bonding process to mount the LED chips to the PCB and when the LED chips are flip blue chips, step (2) comprises applying a die bonding process to mount the LED chips to the PCB.

12. The manufacturing method of the LED encapsulation as claimed in claim 11, wherein the mounting sections each comprise a position-constraining slot, the position-constraining slot having a height substantially equal to a thickness of the quantum dot rail and wherein in step (4), the quantum dot rail is fit in and retained in the position-constraining slots; and in step (5), heating is applied to achieve the curing of the encapsulant.

13. The manufacturing method of the LED encapsulation as claimed in claim 11, wherein each of the LED elements comprises: a second frame and an LED chip mounted to the second frame and electrically connected to the second frame and wherein in step (2), the plurality of LED elements are mounted to the PCB by means of a reflow process and the LED chips are regular, non-flip blue chips or flip blue chips, whereby when the LED chips are non-flip blue chips, the LED chips are subjected to a die bonding process and a wire bonding process to be mounted to the second frames and when the LED chips are flip blue chips, the LED chips are subjected to a die bonding process to be mounted to the second frames.

14. The manufacturing method of the LED encapsulation as claimed in claim 13, wherein the quantum dot rail comprises: a glass tube and a quantum dot material hermetically enclosed in the glass tube, the position-constraining slots having a depth equal to or greater than a tube wall thickness of the glass tube, the glass tube having an end having a rectangular cross-section; the four sidewalls are made of poly-1,4-cyclohexylene dimethylene terephthalate; and the encapsulant is silicone gel.

* * * * *